United States Patent
Wang

(10) Patent No.: US 7,405,144 B2
(45) Date of Patent: Jul. 29, 2008

(54) METHOD FOR MANUFACTURING PROBE CARD

(75) Inventor: Jiun-Heng Wang, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 54 days.

(21) Appl. No.: 11/550,910

(22) Filed: Oct. 19, 2006

(65) Prior Publication Data

US 2008/0009085 A1    Jan. 10, 2008

(30) Foreign Application Priority Data

Jul. 7, 2006    (TW)    .............................. 95124781 A

(51) Int. Cl.
*H01L 21/44*    (2006.01)
(52) U.S. Cl. ............... 438/612; 438/106; 257/E21.231; 257/E21.238; 257/E21.508; 257/E21.499; 257/E21.517
(58) Field of Classification Search ................. 438/612, 438/106, 22, 463, 270, 582, 613, 685, 637
See application file for complete search history.

(56) References Cited

U.S. PATENT DOCUMENTS

| | | | | | |
|---|---|---|---|---|---|
| 5,325,052 | A | * | 6/1994 | Yamashita | .................... 324/754 |
| 6,265,888 | B1 | * | 7/2001 | Hsu | ............................ 324/760 |
| 6,608,385 | B2 | * | 8/2003 | Zhou et al. | ................... 257/773 |
| 7,227,370 | B2 | * | 6/2007 | Kasukabe | .................... 324/754 |

* cited by examiner

*Primary Examiner*—David Nhu
(74) *Attorney, Agent, or Firm*—J.C. Patents

(57) ABSTRACT

A method for manufacturing a probe card is provided. A first inactive layer, a first patterned photoresist layer and a first metal layer are sequentially formed on a substrate. The first metal layer has first through holes exposing a portion of the first patterned photoresist layer. A second inactive layer and a second patterned photoresist layer are sequentially formed thereon. The second patterned photoresist layer has second through holes exposing the first through holes. Pins are formed inside the first and the second through holes. A second metal layer is formed on the second patterned photoresist layer. One end of each pin is connected to the second metal layer. The pins and the second metal layer are taken out. A circuit carrier having third through holes is provided. The pins are inserted into the third through holes. The second metal layer is patterned to form pinheads.

10 Claims, 3 Drawing Sheets

METHOD FOR MANUFACTURING PROBE CARD

CROSS-REFERENCE TO RELATED APPLICATION

This application claims the priority benefit of Taiwan application serial no. 95124781, filed on Jul. 07, 2006. All disclosure of the Taiwan application is incorporated herein by reference.

BACKGROUND OF THE INVENTION

1. Field of the Invention

The present invention relates to a method for manufacturing a testing module, and more particularly, to a method of manufacturing of a probe card.

2. Description of Related Art

The testing of integrated circuit (IC) chips is necessary in different stages of the semiconductor manufacturing process. The configuration of each IC chip in a wafer or a package must be tested to ensure the reliability of its electrical functionality. With the enhanced function and ever-increasing complexity of an IC chip, the need for a high speed and accurate testing is increasingly important.

The process of testing individual chip in a wafer configuration is called a wafer testing. In the wafer test, an electrical connection is temporarily established between the chip and automatic testing equipment. Wafer testing is important to IC design and chip function because good IC chips of desired quality are found in the wafer testing before the chips are separated and subsequently packaged.

The testing method includes forming a testing circuit between a testing station and a probe card such that the probe pins on the probe card are in direct contact with pads or bumps on the chip. By probing the chips on the wafer with probe pins, signals of the chips can be output and these signal data is transmitted to the testing station for further analysis and decisions. Thus, before performing the subsequent packaging process, electrically and functionally inferior chips are screened and removed to prevent any increase in the cost of packaging as a result of incorporating not-so-reliable chips.

However, as the pitch between pads or the bumps is reduced; the pitch between robe pins must be reduced correspondingly. Moreover, as the area of the pads or bumps is reduced, the diameter of each probe pin must be reduced as well. Hence, a bottleneck is formed in the conventional manufacturing technique.

SUMMARY OF THE INVENTION

Accordingly, at least one objective of the present invention is to provide a method for manufacturing a probe card capable of enhancing the precision of position and diameter of probe pins.

At least a second objective of the present invention is to provide a method for manufacturing a probe card capable of lowering the cost of producing the probe card.

To achieve these and other advantages and in accordance with the purpose of the invention, as embodied and broadly described herein, the invention provides a method for manufacturing a probe card. The method includes the following steps. First, a substrate is provided. Then, a first inactive layer is formed on the substrate. A first patterned photoresist layer is formed on the first inactive layer. A first metal layer is formed on the first inactive layer and the first patterned photoresist layer. The first metal layer has a plurality of first through holes exposing a portion of the first patterned photoresist layer. Moreover, the diameter of each first through hole increases from the lower surface of the first metal layer toward the top surface of the first metal layer. Next, a second inactive layer is formed on the first metal layer and the first patterned photoresist layer. Then, a second patterned photoresist layer is formed on the second inactive layer. The second patterned photoresist layer has a plurality of second through holes exposing the first through holes. Pins are formed inside the second through holes and the first through holes. A second metal layer is formed on the second patterned photoresist layer. One end of each pin is connected to the second metal layer. The pins and the second metal layer are taken out. A circuit carrier having a plurality of third through holes is provided. Then, the pins are inserted into the third through holes. After that, the second metal layer is patterned to form a plurality of pinheads. Each pinhead is connected to one of the pins.

In one embodiment of the present invention, the material of the first inactive layer can be chromium, titanium or stainless steel.

In one embodiment of the present invention, the material of the second inactive layer can be chromium or titanium.

In one embodiment of the present invention, the method of taking the pins and the second metal layer out includes detaching the second inactive layer and the pins. Then, the second patterned photoresist layer is removed.

In one embodiment of the present invention, the substrate can be a silicon wafer, an optical glass substrate or a stainless steel substrate.

The present invention also provides an alternative method for manufacturing a probe card including the following steps. First, a substrate is provided. Then, an inactive layer is formed on the substrate. Next, a first patterned photoresist layer is formed on the inactive layer. After that, a first metal layer is formed on the inactive layer and the first patterned photoresist layer. The first metal layer has a plurality of first through holes exposing a portion of the first patterned photoresist layer. Furthermore, the diameter of the first through hole gradually increases from the lower surface of the first metal layer to the upper surface of the first metal layer. An inactivation treatment is performed on the first metal layer and the first patterned photoresist layer. Then, a second patterned photoresist layer is formed on the first metal layer. The second patterned photoresist layer has a plurality of second through holes exposing the first through holes. Pins are formed inside the second through holes and the first through holes. A second metal layer is formed on the second patterned photoresist layer. One end of each pin is connected to the second metal layer. The pins and the second metal layer are taken out. Thereafter, a circuit carrier having a plurality of third through holes is provided. The pins are inserted into the third through holes. The second metal layer is patterned to form a plurality of pinheads. Each pinhead is connected to one of the pins.

In one embodiment of the present invention, the inactivation treatment can be an immersion process in a pool of inactivation liquid.

In one embodiment of the present invention, the material of the inactivation layer can be chromium or titanium.

In one embodiment of the present invention, the method of taking the pins and the second metal layer includes detaching the first metal layer from the pins. Then, the second patterned photoresist layer is removed.

In one embodiment of the present invention, the substrate can be a silicon wafer, an optical glass substrate or a stainless steel substrate.

Accordingly, the present invention adopts semiconductor processes to define the location and geometric dimension of the probe pins. Then, the probe pin array is taken out utilizing the rather weak bonding between the pins and the second inactive layer. Therefore, the precision of the position and the geometric dimension of the pins are significantly enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
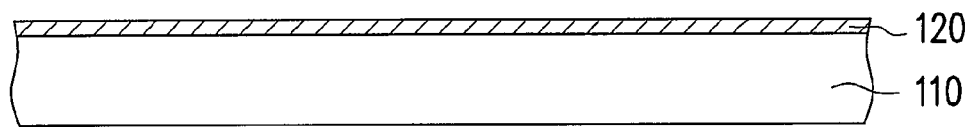
FIGS. 1A through 1H are schematic cross-section views showing the steps for manufacturing a probe card according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1H are schematic cross-section views showing the steps for manufacturing a probe card according to one embodiment of the present invention. The method for manufacturing the probe card in the present embodiment includes the following steps. First, as shown in FIG. 1A, a substrate 110 is provided. A first inactivation layer 120 is formed on the substrate 110. The method of forming the first inactivation layer 120 includes, for example, performing a metal deposition process. Furthermore, the first inactivation layer 120 can be fabricated using chromium or titanium. However, the first inactivation layer 120 may be a layer already formed on the substrate 110 in a previous process. Moreover, the substrate 110 is a silicon wafer, an optical glass substrate or a stainless steel substrate.

Figure 1B:
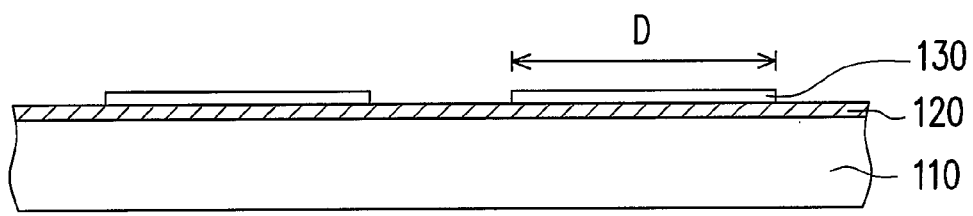

As shown in FIG. 1B, a first patterned photoresist layer 130 is formed on the first inactive layer 120. The method of forming the first inactive layer 120 includes, for example, coating a photoresist material layer over the first inactive layer 120. Then, an exposure process and a development process are performed on the photoresist layer to form the first patterned photoresist layer 130. The positions of the first patterned photoresist layer 130 coincide or correspond with the positions for forming the probe pins. In other words, the patterned positions on the integrated circuit (IC) are the testing points. The size of the pattern is based on the geometry, which will be described below.

Figure 1C:
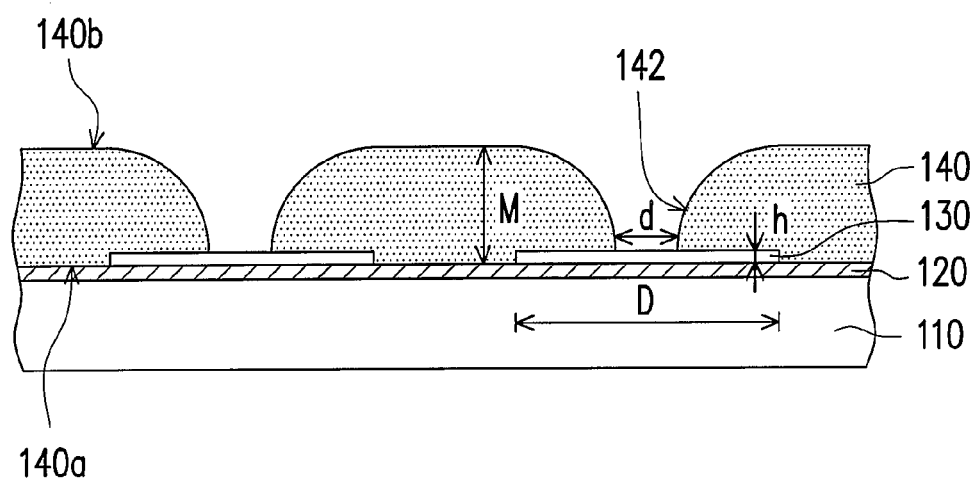

As shown in FIG. 1C, an electro-casting process is performed on the first inactivation layer 120 and the first patterned photoresist layer 130 to form a first metal layer 140. The first metal layer 140 has a plurality of first through holes 142 exposing a portion of the first patterned photoresist layer 130. In addition, the first metal layer 140 is fabricated using nickel, for example. It should be noted that, in the electro-casting process, when the thickness of the first metal layer 140 is greater than that of the first patterned photoresist layer 130, the first metal layer 140 would extend laterally. In other words, the first metal layer 140 gradually covers the surface of the first patterned photoresist layer 130. Therefore, the diameter of the first through holes 142 gradually increase from the lower surface 140a of the first metal layer 140 towards the upper surface 140b of the first metal layer 140.

More specifically, if the first patterned photoresist layer 130 has a thickness h, the first through hole 142 has a diameter d, the first metal layer 140 has a thickness M, then the diameter D of the first patterned photoresist layer 130 can be represented by the formula: $D=d+2(M-h)$.

Figure 1D:
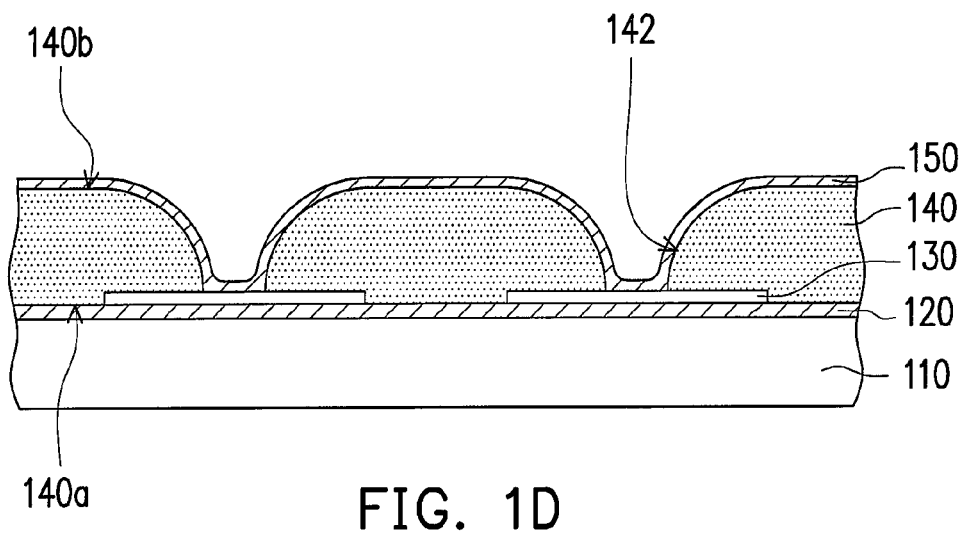

As shown in FIG. 1D, a second inactivation layer 150 is formed on the first metal layer 140 and the first patterned photoresist layer 130. The method of forming the second inactivation layer 150 includes, for example, performing a metal deposition process. The second inactivation layer 150 can be fabricated using chromium or titanium. It should be noted that, in another embodiment, if the second inactivation layer 150 is not formed, an inactivation treatment of the structure formed by the foregoing process could be performed. Moreover, the inactivation treatment includes immersing the structure in an inactivation liquid. The inactivation liquid is, for example, a phosphoric acid solution.

Figure 1E:
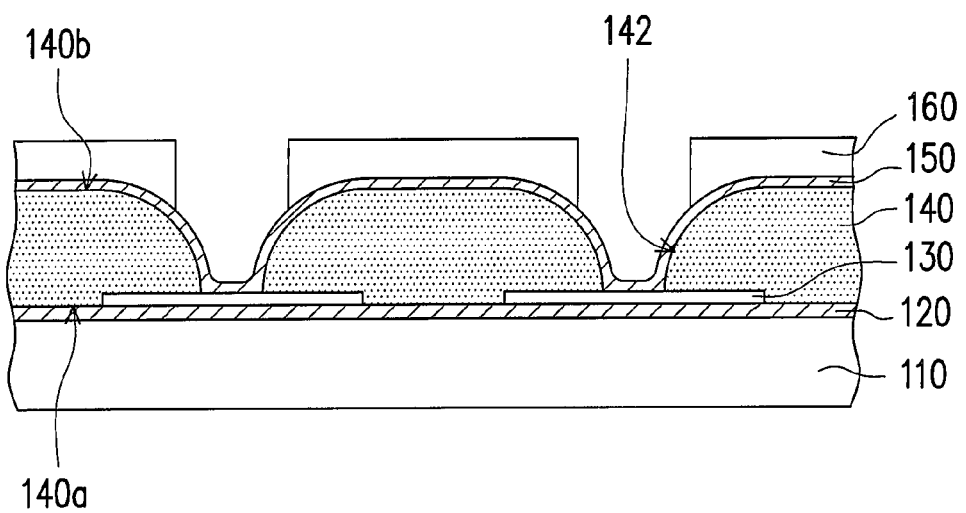

As shown in FIG. 1E, a second patterned photoresist layer 160 is formed on the second inactivation layer 150. The second patterned photoresist layer 160 has a plurality of second through holes 162 exposing the first through holes 142. In the present embodiment, the second patterned photoresist layer 160 has a thickness greater than 100 microns. The second patterned photoresist layer 160 is formed in a similar way to the first patterned photoresist layer 130. It should be noted that, if the inactivation treatment is performed, then the second patterned photoresist layer 160 is directly formed on the first metal layer 140.

Figure 1F:
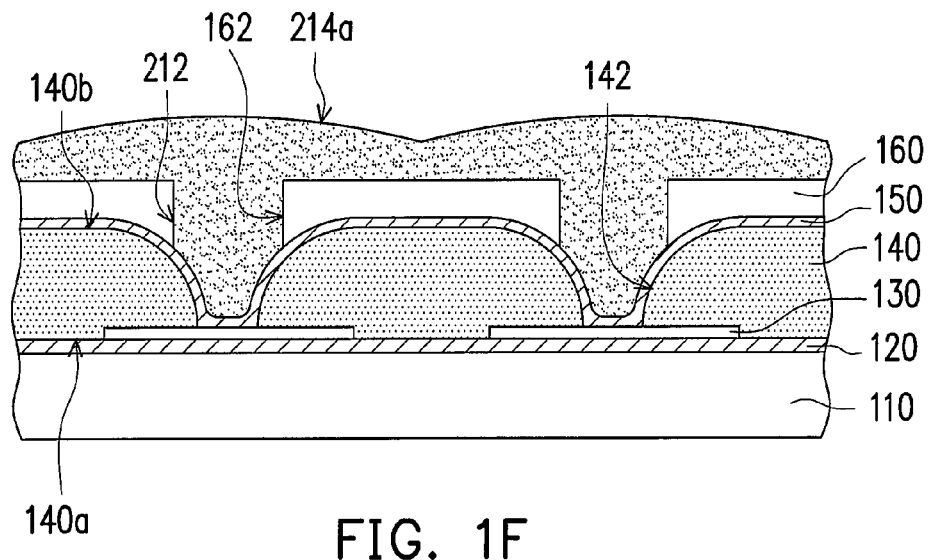

As shown in FIG. 1F, an electro-casting process is performed on the second through holes 162 and the first through holes 160 to form a plurality of pins 212 inside them and a second metal layer 214a on the second patterned photoresist layer 160. One end of each pin 212 is connected to the second metal layer 214a. The smallest diameter of the pin 212 is identical to the smaller diameter of the first through holes 142.

More specifically, metallic material is deposited into the second through holes 162 and the first through holes 142 at the beginning of the electro-casting process to form the pins 212. Then, the electro-casting process is continued to form the second metal layer 214a covering the second patterned photoresist layer 160. The electro-casting process is mostly completed at about this time. Therefore, the pins 212 are connected to the second metal layer 214a.

Figure 1G:
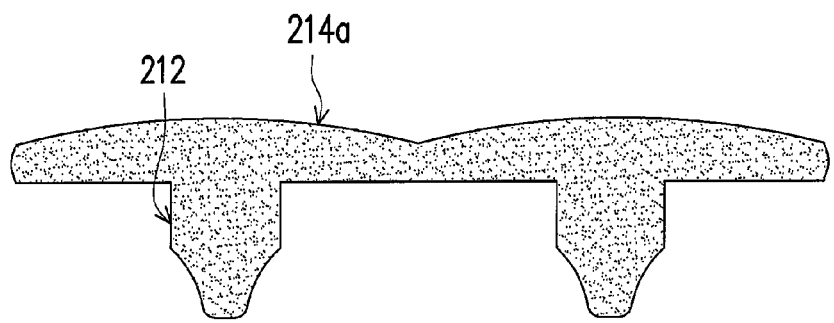

As shown in FIG. 1G, a mold detaching operation is performed to take out the pins 212 and the second metal layer 214a. More specifically, because the pins 212 and the second inactivation layer 140 have weaker bonding, the second inactivation layer 140 and the pins 212 can easily separate from each other. In the present embodiment, the second inactivation layer 140 can be fabricated using chromium or titanium. Therefore, the second inactivation layer 140 can be separated from the pins 212 by percussion or peeling. After that, the second patterned photoresist layer 160 is removed.

It should be noted that the first metal layer 140 could be easily separated from the first inactivation layer 120 due to the weaker bonding between the first metal layer 140 and the first inactivation layer 120. In other words, the substrate 110 and the first inactivation layer 120 can be repeatedly used.

Figure 1H:
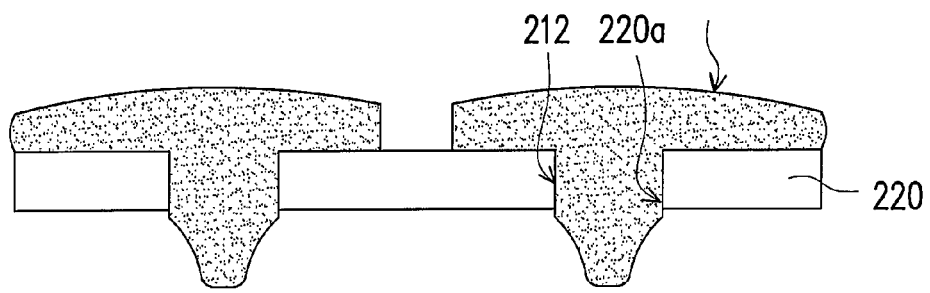

As shown in FIG. 1H, a circuit carrier 220 is provided. The circuit carrier 220 is a printed circuit board, for example. The circuit carrier 220 has a plurality of third through holes 220a. The pins 212 are inserted into the third through holes 220a.

The pins 212 and the second metal layer 214a are fixed onto the circuit carrier 220 by soldering, for example.

Afterwards, the second metal layer 214a is patterned to form a plurality of pinheads 214. Furthermore, each pinhead 214 is connected to one of the pins 212. In other words, after the patterning process, the pins 212 are electrically insulated from one another. The method of patterning the second metallic layer 214a includes applying a laser cutting operation. Up to this stage, the steps for fabricating the probe card are almost complete.

Because the geometric dimension of the pins 212 can be controlled through the thickness h of the first patterned photoresist layer, the diameter D of the first patterned photoresist layer, the thickness M of the first metal layer 140 and the diameter of the second through holes 162, the position and diameter of the pins 212 in probe card manufactured according to the present invention have greater precision.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a probe card comprising:
   providing a substrate and forming a first inactivation layer on the substrate;
   forming a first patterned photoresist layer on the first inactivation layer;
   forming a first metal layer on the first inactivation layer and the first patterned photoresist layer, wherein the first metal layer has a plurality of first through holes exposing a portion of the first patterned photoresist layer, and a diameter of the first through holes gradually increases from a lower surface of the first metal layer to an upper surface of the first metal layer;
   forming a second inactivation layer on the first metal layer and the first patterned photoresist layer;
   forming a second patterned photoresist layer on the second inactivation layer, wherein the second patterned photoresist layer has a plurality of second through holes exposing the first through holes;
   forming a plurality of pins inside the second through holes and the first through holes and forming a second metal layer on the second patterned photoresist layer such that one end of the pin connects with the second metal layer;
   taking out the pins and the second metal layer;
   providing a circuit carrier, wherein the circuit carrier has a plurality of third through holes, and the pins are inserted into the third through holes; and
   patterning the second metal layer to form a plurality of pinheads such that each pinhead connects with one of the pins.

2. The method of manufacturing a probe card of claim 1, wherein a material of the first inactivation layer comprises chromium, titanium or stainless steel.

3. The method of manufacturing a probe card of claim 1, wherein a material of the second inactivation layer comprises chromium or titanium.

4. The method of manufacturing a probe card of claim 1, wherein the step of taking out the pins and the second metal layer comprises:
   separating the second inactivation layer from the pins; and
   removing the second patterned photoresist layer.

5. The method of manufacturing a probe card of claim 1, wherein the substrate comprises a silicon wafer, an optical glass substrate or a stainless steel substrate.

6. A method of manufacturing a probe card comprising:
   providing a substrate and forming an inactivation layer thereon;
   forming a first patterned photoresist layer on the substrate;
   forming a first metal layer on the inactivation layer and the first patterned photoresist layer, wherein the first metal layer has a plurality of first through holes exposing a portion of the first patterned photoresist layer, and a diameter of the first through holes gradually increases from a lower surface of the first metal layer to an upper surface of the first metal layer;
   performing an inactivation treatment on the first metal layer and the first patterned photoresist layer;
   forming a second patterned photoresist layer on the first metal layer, wherein the second patterned photoresist layer has a plurality of second through holes exposing the first through holes;
   forming a plurality of pins inside the second through holes and the first through holes and forming a second metal layer on the second patterned photoresist layer, wherein one end of each pin connects with the second metal layer;
   taking out the pins and the second metal layer;
   providing a circuit carrier, wherein the circuit carder has a plurality of third through holes, and the pins are inserted into the third trough holes; and
   patterning the second metal layer to form a plurality of pinheads such that each pinhead connects with one of the pins.

7. The method of manufacturing a probe card of claim 6, wherein the inactivation treatment comprises immersing the substrate in an inactivation liquid.

8. The method of manufacturing a probe card of claim 6, wherein a material of the inactivation layer comprises chromium or titanium.

9. The method of manufacturing a probe card of claim 6, wherein the step of taking out the pins and the second metal layer comprises:
   separating the first metal layer from the pins; and
   removing the second patterned photoresist layer.

10. The method of manufacturing a probe card of claim 6, wherein the substrate comprises a silicon wafer, an optical glass substrate or a stainless steel substrate.

* * * * *